(12) United States Patent
Rippke et al.

(10) Patent No.: US 7,112,867 B2
(45) Date of Patent: Sep. 26, 2006

(54) RESISTIVE ISOLATION BETWEEN A BODY AND A BODY CONTACT

(75) Inventors: Ian Rippke, Ithaca, NY (US); Stewart Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/727,552

(22) Filed: Dec. 5, 2003

(65) Prior Publication Data
US 2005/0127452 A1    Jun. 16, 2005

(51) Int. Cl.
*H01L 29/00* (2006.01)
*H01L 23/62* (2006.01)
(52) U.S. Cl. .................. 257/532; 257/504; 257/359; 257/523; 257/656; 257/E27.035; 257/E29.011; 257/E29.018
(58) Field of Classification Search ............... 257/372, 257/371, 379, 394, 409, 536, 547, 516, 513, 257/515, 504, 369, E27.035, E29.011, E29.018, 257/523, 656, 359
See application file for complete search history.

(56) References Cited

U.S. PATENT DOCUMENTS

| | | | |
|---|---|---|---|
| 3,871,007 A * | 3/1975 | Wakamiya et al. | 257/523 |
| 5,471,419 A * | 11/1995 | Sankaranarayanan et al. | 365/177 |
| 5,818,085 A * | 10/1998 | Hsu et al. | 257/347 |
| 5,920,089 A * | 7/1999 | Kanazawa et al. | 257/202 |
| 6,054,736 A * | 4/2000 | Shigehara et al. | 257/336 |
| 6,246,094 B1 * | 6/2001 | Wong et al. | 257/397 |
| 6,876,055 B1 * | 4/2005 | Iwata et al. | 257/510 |
| 6,876,106 B1 * | 4/2005 | Miyashita et al. | 310/12 |

* cited by examiner

*Primary Examiner*—Kenneth Parker
*Assistant Examiner*—Joseph Nguyen
(74) *Attorney, Agent, or Firm*—Venable LLP; Jeffrey W. Gluck

(57) ABSTRACT

A high resistance region may be used to isolate the body of a first transistor from a body contact.

21 Claims, 6 Drawing Sheets

RESISTIVE ISOLATION BETWEEN A BODY AND A BODY CONTACT

BACKGROUND

In conventional stacked devices, isolated wells for transistors may be used to reduce the body effect and the corresponding shifts in threshold voltages of the transistors. Despite having such benefits, additional costs of forming isolated wells for transistors render its implementation less desirable. As an alternative, low threshold voltage transistors may be used to reduce the body effect. However, low threshold voltage transistors may respond poorly to signals because of their grounded bodies. With the bodies connected to ground, the performance of transistors (e.g., low threshold voltage transistors) may suffer from the accompanying body effect.

BRIEF DESCRIPTION OF THE DRAWINGS

The invention may be understood by referring to the following description and accompanying drawings that are used to illustrate the embodiments of the invention. In the drawings.

DETAILED DESCRIPTION OF THE INVENTION

In the following description, numerous specific details are set forth. However, it is understood that embodiments of the invention may be practiced without these specific details. In other circumstances, well known circuits, structures and techniques have not been shown in detail in order not to obscure an understanding of this description.

References to an "exemplary embodiment" indicate that the embodiment(s) of the invention so described may include a particular feature, structure, or characteristic, but not every embodiment necessarily includes the particular feature, structure, or characteristic. Further, repeated use of the phrase "an exemplary embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or lesser contact. However, "coupled" may also mean that two or more elements are not in direct contact with each other, but they still co-operate or interact with each other.

Figure 1:
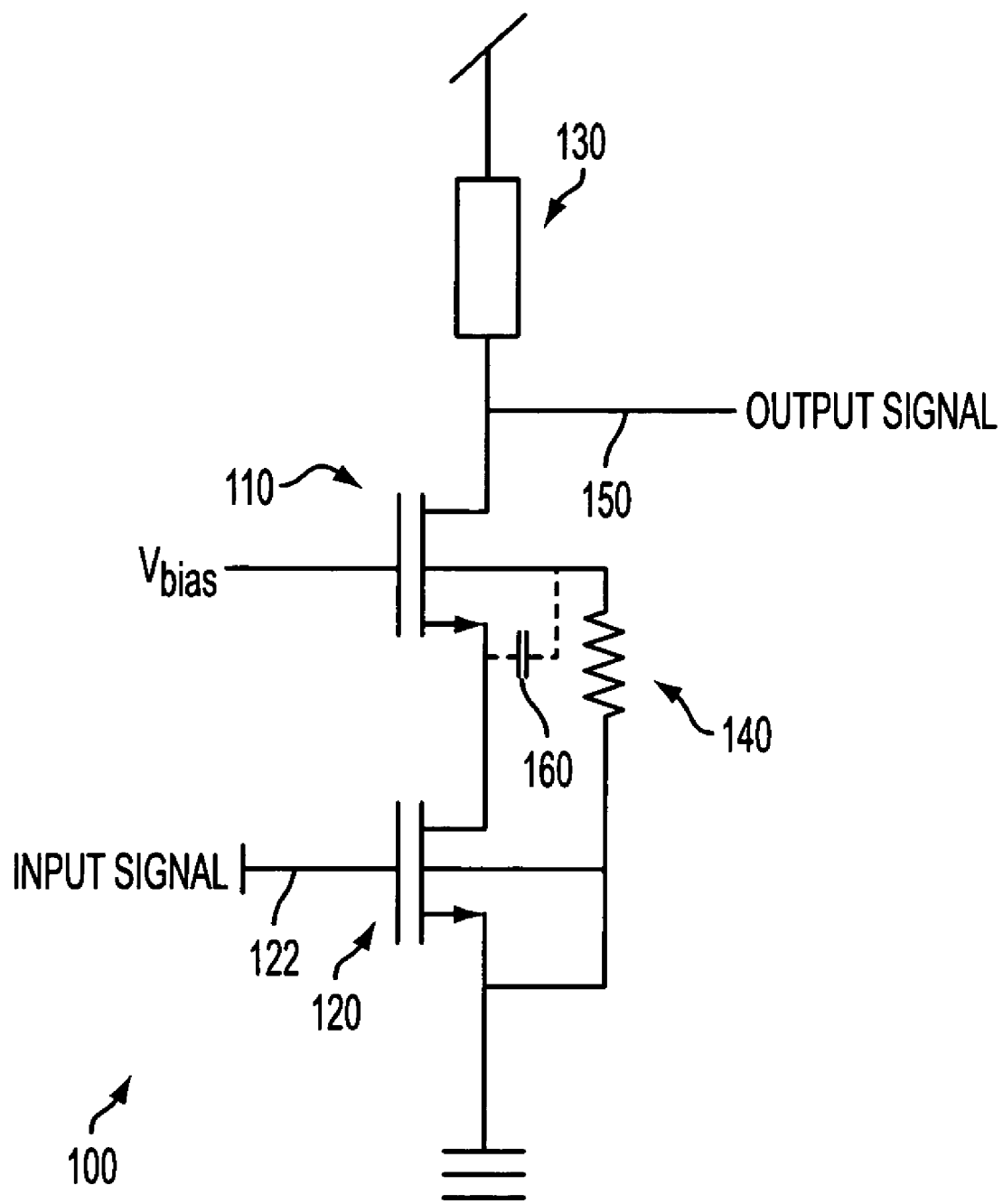
FIG. 1 shows a circuit diagram of a device according to an exemplary embodiment of the invention.

In FIG. 1, a device 100 according to an exemplary embodiment of the invention may receive an input signal (e.g., an alternating current (AC) input signal such as a radio frequency (RF) input signal or any other signal) at a control electrode 122 and may output an output signal (e.g., an AC output signal such as an RF output signal or any other signal) at an output node 150. The device 100 may comprise two transistors 110, 120, which may form a cascaded pair (e.g., a cascode amplifier) as depicted in FIG. 1. The body of the upper transistor 110 may be coupled to ground via a resistance 140. The body of the lower transistor 120 may be coupled to ground without an intervening resistance. The resistance 140 may be large enough to substantially isolate the body of the upper transistor 110 from ground, especially when the input signal at the control electrode 122 is at or above a predetermined operating frequency. By having the body of the upper transistor 110 substantially isolated from ground by the resistance 140, formation of separate wells for the transistors 110, 120 may be obviated. The body and the source of the upper transistor 110 may be coupled to each other by a parasitic source-body capacitance of the upper transistor 110. The parasitic source-body capacitance of the transistors 110, 120 may be a depletion type. A discrete capacitance 160 may optionally be added between the source and the body of the transistor 110, in addition to the parasitic source-body capacitance, to improve the coupling therebetween. With the body isolation from ground, the upper transistor 110 may have an improved response to signals applied to the upper transistor 110 and may exhibit an improved transistor gain.

The lower transistor 120 may receive the input signal at the control electrode 122. The upper transistor 110 may receive a bias voltage Vbias and may be coupled to a load 130 and may output an output signal at an output node 150. The load 130 may be any type of load, including, but not limited to, an inductance, a resistance, a capacitance and a combination of load types. The bias voltage Vbias may be any reference voltage that biases the upper transistor 110 in a desired state, including a constant or variable voltage. A variable voltage used for this purpose may be set at a selected voltage level before the operation of the device 100 or may vary during the operation of the device 100. When the input signal is applied to the control electrode 122 of the transistor 120, the input signal may be amplified by a gain of the device 100 (i.e., a device gain determined by the transistors 120, 110, the bias voltage Vbias, and the load 130) to provide the output signal at the output node 150.

The device 100 may be implemented with n-type transistors as depicted. Alternatively, the device 100 may be implemented with p-type transistors by using any of the conventional ways of converting an n-type transistor circuit to a p-type transistor circuit. For example, the device 100 may also be implemented with p-type transistors by using p-type transistors in place of the n-type transistors and switching the polarity of the power supply voltage.

Figure 2:
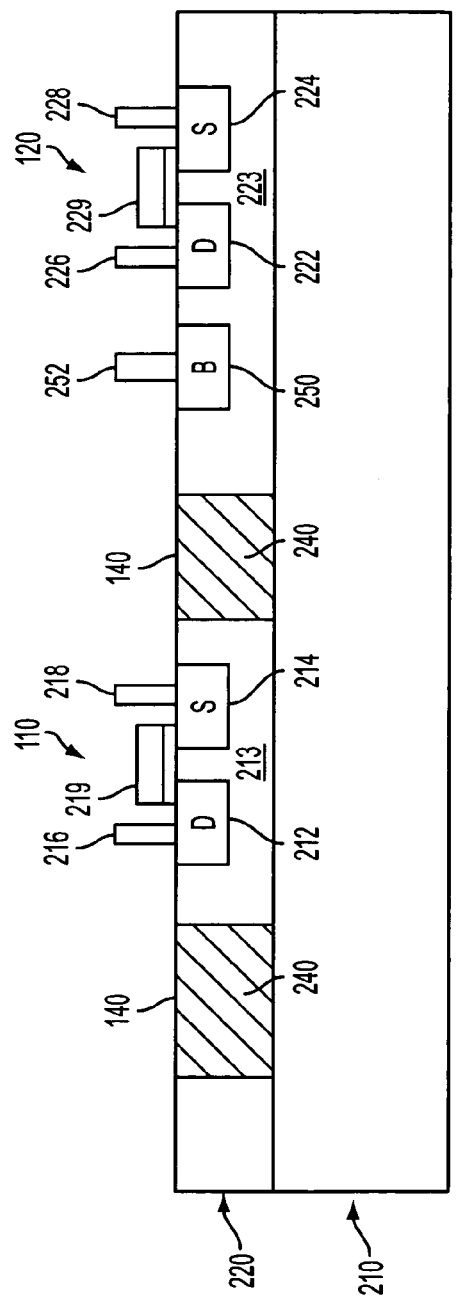
FIG. 2 shows a cross-sectional side view of a device according to an exemplary embodiment of the invention.

In FIG. 2, a partial cross-sectional side view of the transistors 110, 120 in FIG. 1 according to an exemplary embodiment of the invention is shown. A substrate 210, a layer 220 on top of the substrate, and the transistors 110, 120 formed in the layer 220 are shown. The layer 220 may be an epitaxial layer formed on the substrate 210. The substrate 210 and the layer 220 may be formed of a same conductivity type material (e.g., p-type conductivity). When first made, each of the substrate 210 and the layer 220 may have little or no impurity. Thus, each of the substrate 210 and the layer 220 may have a relatively high resistivity. After the initial manufacturing, either or both of the substrate 210 and the layer 220 may be doped with impurities to raise the impurity concentration of the respective layer.

The transistor 110 may have a drain 212, a source 214 and a gate 219. Each of the drain 212 and the source 214 of the transistor 110 may have a contact, 216 and 218, respectively. The transistor 110 may be surrounded by a high-resistance region 240, which reflects the resistance 140 of FIG. 1. Similar to the transistor 110, the transistor 120 may have a drain 222, a source 224 and a gate 229. Each of the drain 222 and the source 224 of the transistor 120 may be coupled to a contact, 226 and 228, respectively. The gates 219, 229 and the contacts 216, 218, 252, 226, and 228 may be formed of any gate/contact material including, but not limited to, metal and poly silicon. A body 223 of the transistor 120 may be coupled to a body contact region 250. The body contact region 250 may form a distinct or integrated region in the body 223 of the second transistor 120, and may be coupled to a contact 252. The magnitude of the intervening high-resistance region 240 may be high enough to substantially isolate the body 213 of the first transistor 110 from the body contact region 250 without having to create the transistor in its own well.

The high-resistance region 240 may be formed in the layer 220, for example, by masking and blocking a region 240 of the layer 220 from a subsequent impurity doping of the layer 220. Thus, the impurity concentration of the high-resistance region 240 of the layer 220 may be lower than an impurity concentration of the unmasked regions of the first layer 220. By having a lower impurity concentration, the high-resistance region 240 may have a resistivity higher than the unmasked regions of the layer 220. Any other known method of creating a resistance may also be used in forming the high-resistance region 240 as long as the overall resistance between the body 213 of the upper transistor 110 and the body contact region 250 is increased. The high-resistance region 240 of the resistance 140 may extend over substantially an entire cross-sectional area of the first layer 220 between the body 213 of the transistor 110 and the body contact region 250 and, thus, may avoid any shunt resistance being created across the high-resistance region 240. The value of the effective resistance 140 due to the high-resistance region 240 may be constant throughout the high-resistance region 240 or may vary. Similarly, the impurity concentration may be constant throughout the resistance region 240 or may vary.

Figure 3:
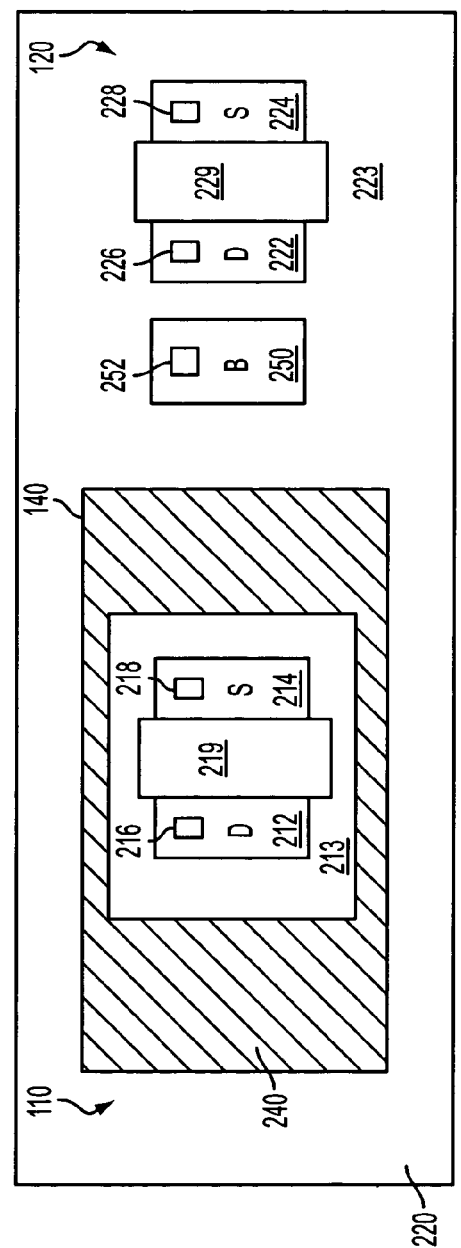
FIG. 3 shows an upper view of a device according to an exemplary embodiment of the invention.

In FIG. 3, a partial upper view of transistors 110, 120 in FIG. 1 according to an exemplary embodiment of the invention is shown. The high-resistance region 240 of the transistor 110 may surround the transistor 110 as depicted to substantially isolate the body 213 of the transistor 110 from the body contact region 250. Alternatively, the high-resistance region 240 may not surround the transistor 110 completely. If the transistors are laid out differently from the layout of FIG. 3, the body 213 of the transistor 110 may be substantially isolated from the body contact region 250 without having the high-resistance region 240 surround the transistor 110 completely.

As shown in FIG. 2, the body 223 of the transistor 120 may be coupled to the body contact region 250 without an intervening resistance. Alternatively, the body 223 of the transistor 120 may be coupled to the body contact region 250 with an intervening resistance. Transistors other than the transistors 110, 120 may have their bodies coupled to the body contact region 250 with or without an intervening resistance.

Figure 4A:
FIGS. 4A–D show a method according to an exemplary embodiment of the invention.
Figure 4B:
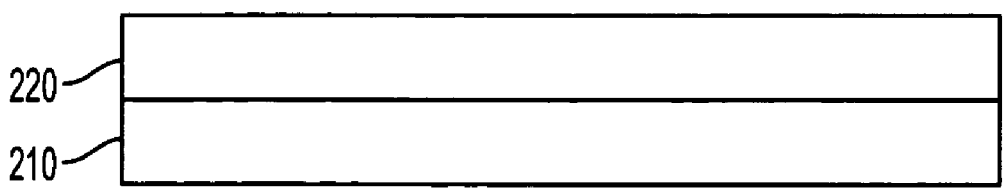
Figure 4C:
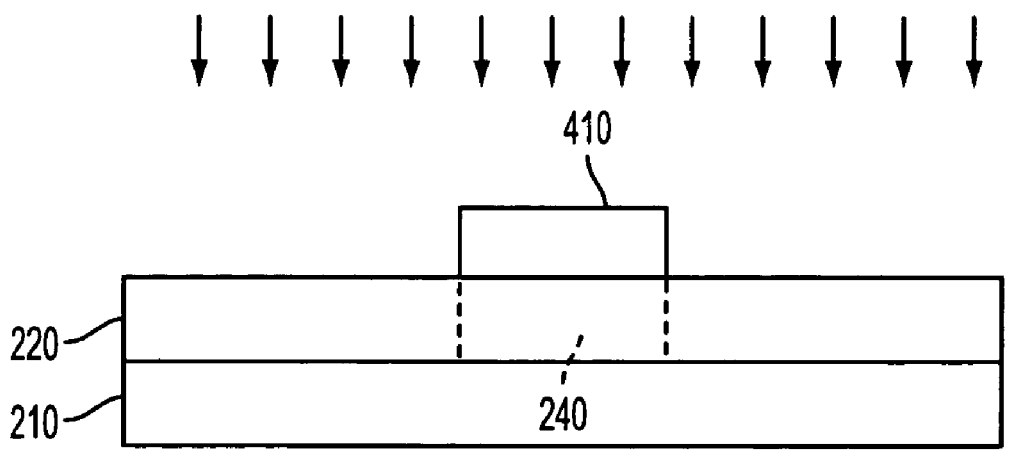
Figure 4D:
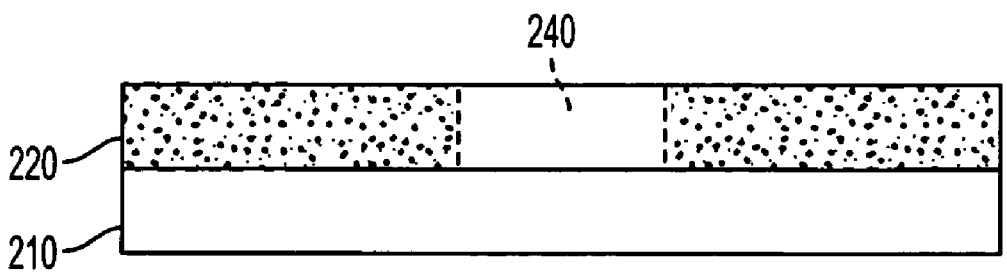

In FIGS. 4A–D, a method of creating a resistance according to an exemplary embodiment of the invention is shown. In FIGS. 4A and 4B, layer 220 may be formed or placed on top of substrate 210. In FIG. 4C, a mask 410 may be placed over a region 240 of the layer 220 corresponding to a high-resistance region to be created. The layer 220 may be implanted with impurities as shown by the arrows while the mask 410 is placed over the region 240. The region 240 may be blocked from being implanted with impurities by the mask 410 to create a high-resistance region 240 having a lower impurity concentration than the unmasked regions of the layer 220. In FIG. 4D, when the mask 410 is removed, the region 240 may then have a lower impurity concentration (and thus, a higher resistance) than unmasked regions of the layer 220. The high-resistance region 240 may be created in any region where a resistance is desired including, but not limited to, a region between a body of a transistor and a body contact region and a region between two transistors (e.g., field-effect transistors (FETs) and bipolar-junction transistors (BJTs)).

Figure 5:
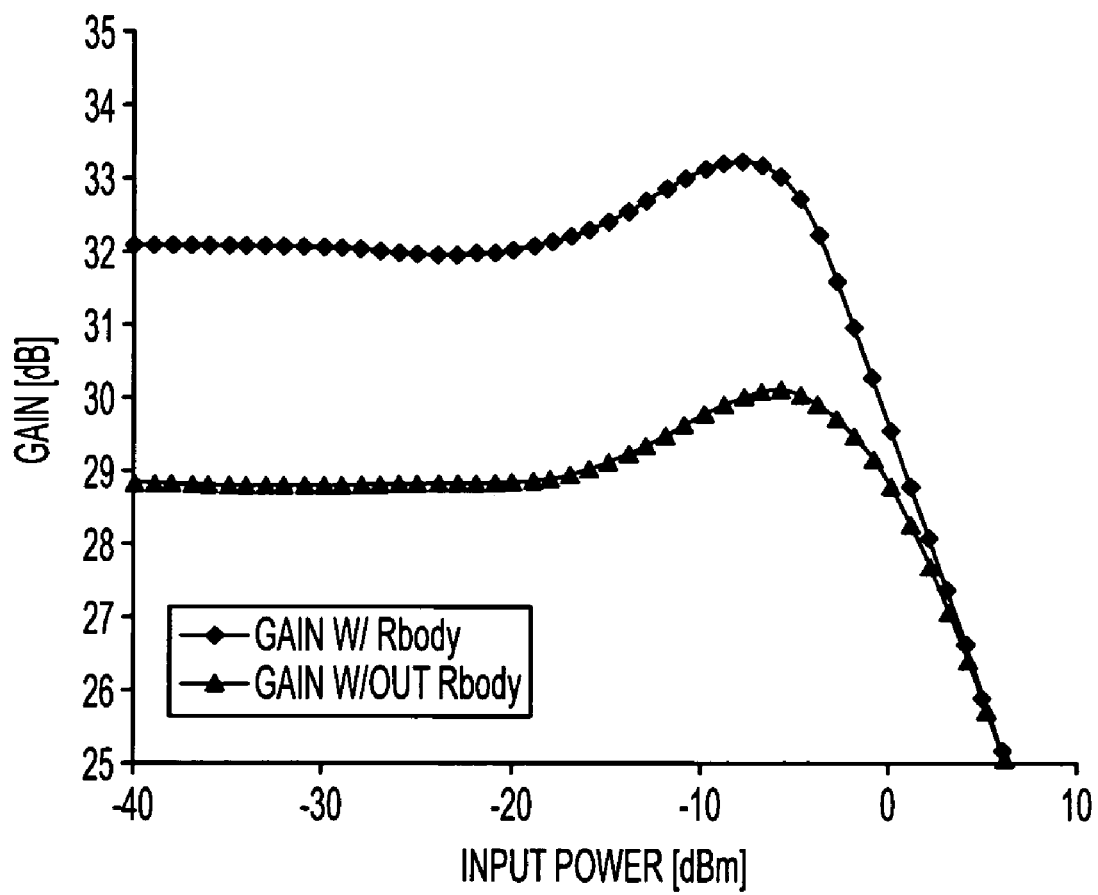
FIG. 5 shows a gain improvement achieved in a complementary metal-oxide semiconductor (CMOS) power amplifier by using a device according to an exemplary embodiment of the invention.

In FIG. 5, a gain improvement achieved in a CMOS power amplifier using the device 100 of FIG. 1 according to an embodiment of the invention is shown. By having the body resistance 140 formed between the body of the transistor 110 and ground, the gain of the CMOS power amplifier incorporating the device 100 of FIG. 1 may be improved by as much as 3.4 dB, although various embodiments of the invention are not limited in this respect. Such gain may correspond to more than doubling the gain of the CMOS power amplifier, for example. The peak efficiency of the CMOS power amplifier may improve from, for example, 28.5% to 30.7%; such improvement in the peak efficiency may be significant in a power amplifier where a lower efficiency represents a significant waste of power.

Figure 6:
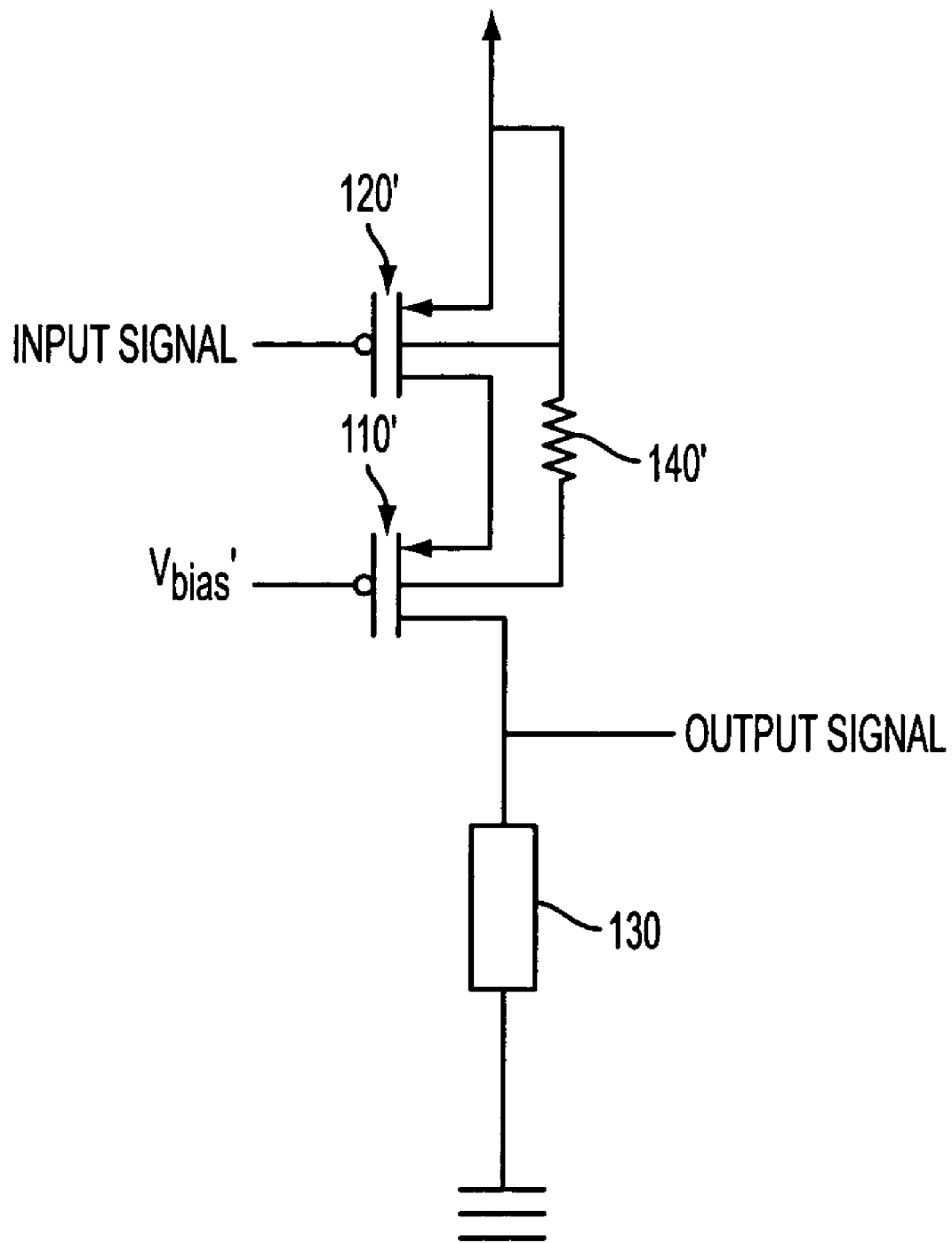
FIG. 6 shows a device according to another exemplary embodiment of the invention.

In FIG. 6, a device 100' with p-type transistors 110', 120' having a body coupled to a power supply via a body resistance 140' according to another exemplary embodiment of the invention is shown. The embodiment of the device 100' in FIG. 6 may be physically analogous to and may operate in a similar way to the embodiment of the device 100 in FIG. 1. As shown in FIG. 6, p-type transistors 110', 120' may be used in place of the n-type transistors in FIG. 1, a polarity of the power supply is changed, and a body of the p-type transistor 110' may be coupled to a power supply via the body resistance 140'. Other known and/or yet to be discovered ways of converting an n-type circuit to a p-type circuit may also be used.

Figure 7:
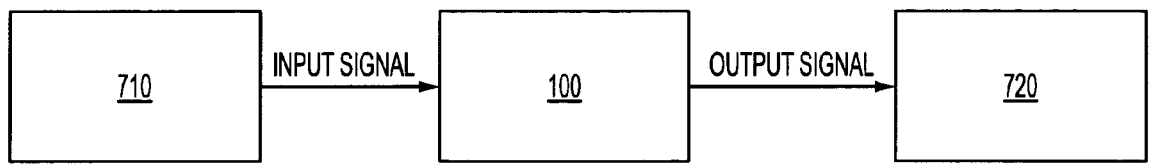
FIG. 7 shows a system incorporating a device according to an exemplary embodiment of the invention.

In FIG. 7, a system using the device 100 according to an exemplary embodiment of the invention is shown. The device 100 may receive an input signal from a signal generating device 710 and may output an output signal to an output device 720. The signal generating device 710 may be any device that produces an input signal including, but not limited to, a data source, a signal generator, a modulator, a receiver or a transceiver, and the output device 720 may be, but is not limited to, a load, such as an antenna, including radio frequency devices and omnidirectional antennas.

The exemplary embodiments shown in FIGS. 1-6 may also be used in any system or device including, but not limited to, power amplifiers (e.g., power amplifiers in advanced CMOS processes with lower operating voltages), highly integrated transceivers for wireless local area networks (LANs) (e.g., an RF wireless LAN) and mobile phone applications.

The foregoing description is intended to be illustrative and not limiting. Variations will occur to those of skill in the art. Those variations are intended to be included in the various embodiments of the invention, which are limited only by the spirit and the scope of the appended claims.

What is claimed is:

1. A device, comprising:
    a material of a first conductivity type;
    a first transistor in the material;
    a body contact region in the material;
    a resistance region disposed in the material between the first transistor and the body contact region to substantially electrically isolate the first transistor from the body contact region, the resistance region having a resistivity higher than a resistivity of the material, wherein the resistance region has a non-zero impurity concentration lower than an impurity concentration of the material; and
    a discrete capacitor coupled between a body and a source of the first transistor.

2. The device of claim 1, further comprising:
    a second transistor disposed in the material, wherein the second transistor is disposed on a same side of the resistance region as the body contact region.

3. The device of claim 1, wherein the body contact region is adapted to be coupled to ground and the first conductivity type is p-type.

4. The device of claim 1, wherein the body contact region is adapted to be coupled to a power supply voltage and the first conductivity type is n-type.

5. The device of claim 1, further comprising a substrate, the material being on the substrate.

6. The device of claim 1, wherein the resistance region occupies substantially an entire cross-sectional area of the material between the first transistor and the body contact region.

7. The device of claim 1, wherein the material is an epitaxial layer.

8. A device, comprising:
    a material of a first conductivity type;
    a first transistor in the material;
    a body contact region in the material;
    a resistance region in the material between the first transistor and the body contact region to substantially electrically isolate the first transistor from the body contact region, the resistance region having a resistivity higher than a resistivity of the material;
    a second transistor coupled in series with the first transistor and having a control electrode adapted to receive an input signal of the device, the first transistor having a control electrode adapted to receive a bias voltage, and the body contact region being adapted to be coupled to a first one of a power supply voltage and ground; and
    a load having a first end coupled to the first transistor and a second end adapted to be coupled to a second one of the power supply voltage and ground, a body of the second transistor being adapted to be coupled to the first one of the power supply voltage and ground.

9. The device of claim 8, wherein the first and second transistors are n-type conductivity transistors.

10. The device of claim 8, wherein the resistance region is adapted to substantially isolate a body of the first transistor from ground.

11. The device of claim 8, wherein the resistance region is adapted to substantially isolate a body of the first transistor from ground when the input signal is at or above a predetermined operating frequency.

12. The device of claim 8, wherein the load is an inductance.

13. A device, comprising:
    a material of a first conductivity type formed directly on a semiconductor substrate;
    a first transistor in the material;
    a body contact region in the material;
    a resistance region disposed in the material between the first transistor and the body contact region, the resistance region having a resistivity higher than a resistivity of the material, wherein the semiconductor substrate is of said first conductivity type;
    a second transistor in the material, wherein the second transistor is on a same side of the resistance region as the body contact region; and
    a discrete capacitor coupled between a body and a source of the first transistor.

14. The device of claim 13, wherein the resistance region substantially isolates the first transistor from the body contact region.

15. The device of claim 13, wherein the body contact region is adapted to be coupled to ground.

16. The device of claim 13, wherein the material is an epitaxial layer.

17. The device of claim 13, wherein the resistance region has an impurity concentration lower than an impurity concentration of the material.

18. The device of claim 13, wherein the resistance region occupies substantially an entire cross-sectional area of the material between the first transistor and the body contact region.

19. A device, comprising:
    a material of a first conductivity type;
    a first transistor in the material;
    a body contact region in the material;
    a resistance region in the material between the first transistor and the body contact region, the resistance region having a resistivity higher than a resistivity of the material, wherein the resistance region comprises the same material as said material but has a non-zero impurity concentration lower than an impurity concentration of said material; and
    a second transistor in the material, wherein the second transistor is disposed on a same side of the resistance region as the body contact region.

20. The device of claim 19, further comprising a substrate, the material being on the substrate.

21. The device of claim 19, wherein the material is an epitaxial layer deposited on a substrate.

* * * * *